United States Patent
Hagi et al.

(10) Patent No.: US 6,180,269 B1
(45) Date of Patent: Jan. 30, 2001

(54) GAAS SINGLE CRYSTAL SUBSTRATE AND EPITAXIAL WAFER USING THE SAME

(75) Inventors: Yoshiaki Hagi; Ryusuke Nakai, both of Itami (JP)

(73) Assignee: Sumitomo Electric Industries, Ltd., Osaka (JP)

(*) Notice: Under 35 U.S.C. 154(b), the term of this patent shall be extended for 0 days.

(21) Appl. No.: 09/334,215

(22) Filed: Jun. 16, 1999

(30) Foreign Application Priority Data

Sep. 28, 1998 (JP) .................................................. 10-273097

(51) Int. Cl.⁷ ....................................................... B32B 9/00
(52) U.S. Cl. ........................... 428/697; 428/689; 428/704; 428/336; 257/607; 257/609; 257/610; 117/954; 420/555; 420/579
(58) Field of Search ................................... 257/607, 609, 257/610; 428/689, 704, 336; 117/954; 420/555, 579

(56) References Cited

U.S. PATENT DOCUMENTS

| | | | |
|---|---|---|---|
| 4,609,530 | * 9/1986 | Morioka et al. | 420/555 |
| 5,229,637 | 7/1993 | Suga et al. . | |
| 5,498,595 | * 3/1996 | Eccleston | 505/235 |
| 5,614,754 | * 3/1997 | Inoue | 257/421 |

FOREIGN PATENT DOCUMENTS

| | | |
|---|---|---|
| 0803593 | 10/1997 | (EP) . |
| 0927777 | 7/1999 | (EP) . |
| 01054724 | 3/1989 | (JP) . |
| 02038400 | 2/1990 | (JP) . |

OTHER PUBLICATIONS

"Studies on correlation between the quality of GaAs LEC crystals and the inert gas pressure" by M. Seifert et al.; Journal of Crystal Growth 158 (1996), pp. 409–417, Federal Republic of Germany.

"Low dislocation density 6–inch diameter GaAs single crystals grown by the VCZ method" by T. Kawase et al., Inst. Phys. Conf. Ser. No. 129, Chapter 2, Int. Symp. GaAs and Related Compounds, Karuizawa, Japan 1992.

"Low–dislocation–density and Low–residual–strain Semi––insulating GaAs Grown by Vertical Boat Method" by T. Kawase et al.; Proc. Of the 9th Conf. on Semiconducting and Insulating Materials, Toulouse, France (1996) pp. 275–278.

* cited by examiner

Primary Examiner—Deborah Jones
Assistant Examiner—Jason D Resnick
(74) Attorney, Agent, or Firm—W. F. Fasse; W. G. Fasse

(57) ABSTRACT

A GaAs single crystal substrate and an epitaxial wafer using the same suppress the generation of slips during growth of the epitaxial layer, and improve the breakdown withstanding characteristic of devices fabricated on such substrates. The GaAs single crystal substrate has a mean dislocation density in plane of at most $2 \times 10^4$ cm$^{-2}$, a carbon concentration of 2.5 to $20.0 \times 10^{15}$ cm$^{-3}$, a boron concentration of 2.0 to $20.0 \times 10^{16}$ cm$^{-3}$, an impurity concentration other than carbon and boron of at most $1 \times 10^{17}$ cm$^{-3}$, an EL2 concentration of 5.0 to $10.0 \times 10^{15}$ cm$^{-3}$, resistivity of 1.0 to $5.0 \times 10^8$ $\Omega \cdot$cm and a mean residual strain measured by photoelastic analysis of at most $1.0 \times 10^{-5}$.

10 Claims, 1 Drawing Sheet

GAAS SINGLE CRYSTAL SUBSTRATE AND EPITAXIAL WAFER USING THE SAME

BACKGROUND OF THE INVENTION

1. Field of the Invention

The present invention relates to a GaAs single crystal substrate and an epitaxial wafer using the same. More specifically, the present invention relates to a GaAs (gallium arsenide) single crystal substrate used for an integrated circuit and a microwave element, and to an epitaxial wafer using the same.

2. Description of the Background Art

Semi-insulating GaAs crystal has been conventionally fabricated through a manufacturing method such as Liquid Encapsulated Czochralski method (LEC method) and Vertical Bridgeman method (VB method).

It has been possible to control dislocation density of the GaAs single crystal substrate within the range of 1000 to 100000 $cm^{-2}$, by adjusting temperature gradient and cooling rate at the time of growth.

Carbon concentration and EL2 concentration of the GaAs single crystal substrate have been controlled by adjusting impurity concentration of a solution, ratio of Ga with respect to As and thermal hysterisis after solidification. Generally, two concentrations, that is, the carbon concentration and the EL2 concentration are considered as factors controlling resistivity. With the carbon concentration being in the range of 0.9 to $10.0\times10^{15}$ $cm^{-3}$ and EL2 concentration being 12.0 to $16.0\times10^{15}$ $cm^{-3}$, a substrate having the resistivity of about 0.1 to about $2.0\times10^{8}$ $\Omega\cdot cm$ has been manufactured.

Reference 1 (T. Kawase et al. Proc. Of the 9th Conf. on Semiconducting and Insulating Materials, Toulouse, France (1996) 275–278) discloses an example of a GaAs single crystal substrate having low dislocation density fabricated through the VB method. The GaAs single crystal substrate has carbon density or concentration of 7 to $8\times10^{15}$ $cm^{-3}$, EL2 concentration after heat treatment of $1.3\times10^{16}$ $cm^{-3}$, resistivity of 3.5 to $6.5\times10^{7}$ $\Omega\cdot cm$, mean dislocation density in plane of 1000 to 2000 $cm^{-2}$, and mean residual strain measured by photoelastic analysis of 0.2 to $0.3\times10^{-5}$.

The conventional GaAs single crystal substrate has been expected to be used as a substrate material of electronic devices requiring high speed operation and low power consumption.

Among substrates used for electronic devices, a substrate having an epitaxial thin film layer grown thereon to provide a device operation layer is referred to as an "epitaxial wafer." In manufacturing the epitaxial wafer, when the epitaxial thin film layer is grown, it is necessary to heat the substrate to a temperature called growth temperature, and to bring the surface of the substrate to be in contact with Ga, As and a small amount of impurity called a dopant, in a liquid or gas phase. The epitaxial wafer having a plurality of epitaxial layers stacked on the substrate is subjected to surface etching, deposition of metal for electrodes, and processed into chips, whereby electronic devices are formed. A fundamental characteristic of a thus formed electronic device is amplification of a voltage input signal. Particularly, an electronic device used for satellite communication or the like is required to have a high output and operability at high voltage. Therefore, there has been greater need for a GaAs single crystal substrate having a superior breakdown withstanding characteristic.

The conventional single crystal substrate, however, generally has low carbon concentration and therefore it cannot withstand thermal stress-strain when the temperature is increased to form the actual epitaxial layer, so that steps, which are referred to as slips, result on the substrate surface. When devices are fabricated on the steps, desired device characteristics cannot be attained, and hence production yield is significantly degraded.

Further, the substrate has low resistivity and a number of deep levels such as EL2 within an energy band, and therefore only devices having a low breakdown withstanding characteristic can be provided.

SUMMARY OF THE INVENTION

An object of the present invention is to solve the above-described problems and to provide a GaAs single crystal substrate and an epitaxial wafer using the same, which suppress the generation of slips at the time of growth of the epitaxial layer and which make it possible to improve the breakdown withstanding characteristic of the devices.

Through various experiments made to attain the above described objects, the inventors have found that in order to prevent generation of slips and to improve the breakdown withstanding characteristic of the devices, it is important to control the boron concentration, which finding has lead to the present invention. As will be described in the following, the present invention is characterized in that, an appropriate boron concentration is defined in the GaSa single crystal substrate.

According to an aspect of the present invention, a GaAs single crystal substrate is provided, which has a mean dislocation density in plane of at most $2\times10^{4}$ $cm^{-2}$, carbon concentration of 2.5 to $20.0\times10^{15}$ $cm^{-3}$, boron concentration of 2.0 to $20.0\times10^{16}$ $cm^{-3}$, impurity concentration other than carbon and boron of at most $1\times10^{17}$ $cm^{-3}$, EL2 concentration of 5.0 to $10.0\times10^{15}$ $cm^{-3}$, resistivity of 1.0 to $5.0\times10^{8}$ $\Omega\cdot cm$, and mean residual strain measured by photoelastic analysis of at most $1.0\times10^{-5}$.

Carbon concentration, boron concentration and impurity concentration other than carbon and boron can be adjusted to 2.5 to $20.0\times10^{15}$ $cm^{-3}$, 2.0 to $20.0\times10^{16}$ $cm^{-3}$ and at most $1\times10^{17}$ $cm^{3}$, respectively, by adjusting carbon concentration and boron concentration in the raw material melt when the crystal is grown.

The mean dislocation density in plane, EL2 concentration and resistivity can be adjusted to at most $2\times10^{4}$ $cm^{-2}$, 5.0 to $10.0\times10^{15}$ $cm^{-3}$ and 1.0 to $5.0\times10^{8}$ $\Omega\cdot cm$, respectively, by adjusting ratio of Ga with respect to As and thermal hysterisis after crystal solidification.

Further, the mean residual strain (|Sr-St|) measured by photoelastic analysis can also be suppressed to at most $1.0\times10^{-5}$, by controlling thermal hysterisis after solidification.

When the GaAs single crystal substrate in accordance with the present invention is used as a substrate for an epitaxial wafer, generation of slips when the temperature is increased can be suppressed, because of the influence of carbon and boron impurity concentrations and because of the characteristics of lower residual strain and dislocation density attained by thermal hysterisis control. As a result, production yield of the devices can be improved significantly.

Further, as the EL2 concentration is kept low while boron concentration is increased, high resistance is realized. As a result, the breakdown withstanding characteristic can be improved when the devices are fabricated.

Preferably, the GaAs single crystal substrate in accordance with the present invention may further be characterized in that a deep level (activation energy of 0.31±0.05 eV) detected by thermally stimulated current method is at least $1×10^{15}$ cm$^{-3}$.

The deep level (activation energy of 0.31±0.05 eV) detected by the thermally stimulated current method can be adjusted to a value of at least $1×10^{15}$ cm$^{-3}$, by adjusting the ratio of Ga and As and by controlling thermal hysterisis after crystal solidification.

In this manner, by controlling concentrations of impurities in the raw material melt and controlling thermal hysterisis after solidification, the GaAs single crystal substrate which meets the characteristics of the present invention can be fabricated.

Further, when the GaAs single crystal substrate in accordance with the present invention is used as a substrate for an epitaxial wafer, higher resistance can be attained, as the deep level (activation energy of 0.31±0.05 eV) detected by the thermally stimulated current method is high. As a result, the breakdown withstanding characteristic at the time of fabricating devices can further be improved.

According to another aspect of the present invention, an epitaxial wafer is provided, which has a thin film of at least 0.1 μm in thickness epitaxially grown on the GaAs single crystal substrate in accordance with the present invention described above.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

EXAMPLE

Samples of GaAs single crystal having the diameter of 100 mm and the length of straight body of 100 mm were grown through the VB method.

Other than raw material GaAs, carbon and boron were added with the amounts to be added changed variously on the order of ppm, and melted together with the raw material GaAs, and a crystal was grown in thermal environment having temperature gradient of 2 to 10° C./cm. After the crystal was grown, the samples were cooled at a rate of 10 to 100° C./hour. Thereafter, the crystal samples were subjected to heat treatment at the temperature range of 100 to 1000° C. in a heat treatment furnace.

Characteristics of the crystal samples obtained in this manner are as shown in Tables 1 to 3.

Carbon concentration and EL2 concentration were calculated based on absorption of light at a prescribed wavelength. Impurity concentration other than carbon was evaluated by glow discharge mass spectrometry (GDMS), the resistivity was evaluated by Hall effect and resistivity measurement (the van der Pauw method), the residual strain was evaluated by photoelastic analysis using infrared light, and the deep level was evaluated by the thermally stimulated current method.

In the thermally stimulated current method, samples cooled to 80 K in the dark were irradiated with single color light having the wavelength of 830 nm until the generated photocurrent attained a stable state, and thereafter, the samples were again heated in the dark and electric signals were captured. Carrier concentration and temperature dependency of life time were normalized based on temperature dependency of the photoconductive gain coefficient, and level concentration of activation energy of 0.31 eV was found.

Figure 1:
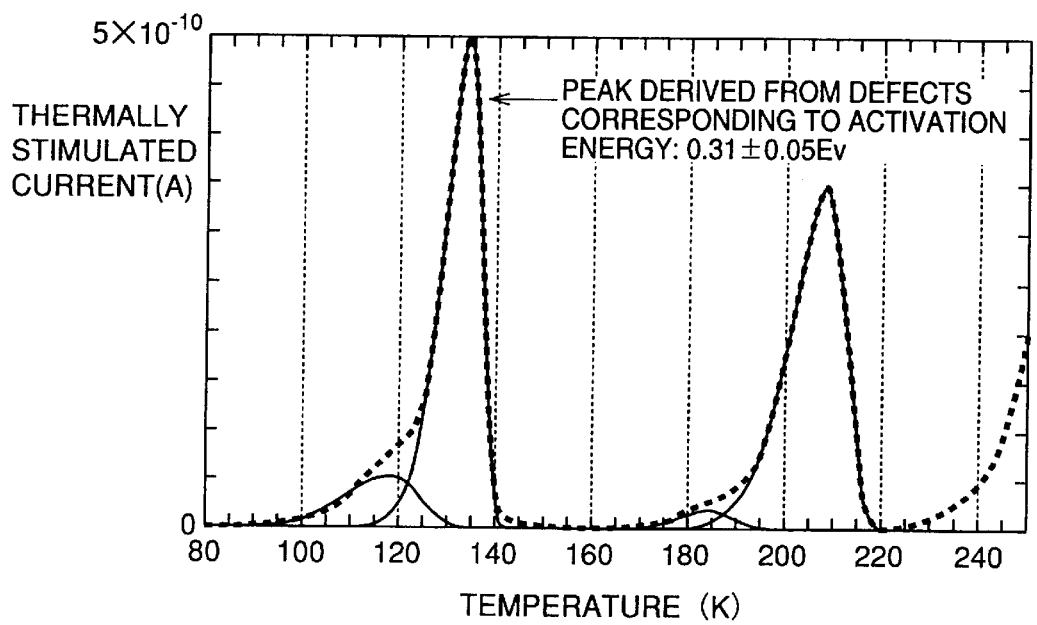
FIG. 1 is a graph representing a thermally stimulated current spectrum of a GaSa single crystal substrate after heat treatment, according to the invention.

FIG. 1 is a graph representing a thermally stimulated current spectrum after heat treatment, in which the abscissa represents temperature (K) and the ordinate represents thermally stimulated current (A). Referring to FIG. 1, in this example, the concentration of the deep level of 0.31±0,05 eV is $3.8×10^{14}$ cm$^{-3}$.

As to the number of slips, samples were heated to 600° C. at the rate of 100° C./hour using an MBE furnace, whereby a GaAs layer having the thickness of 1 μm was epitaxially grown. After growth, the samples were cooled at the same rate, steps on the surfaces of the removed substrates were measured, and the number of slips per substrate was counted.

Figure 2:
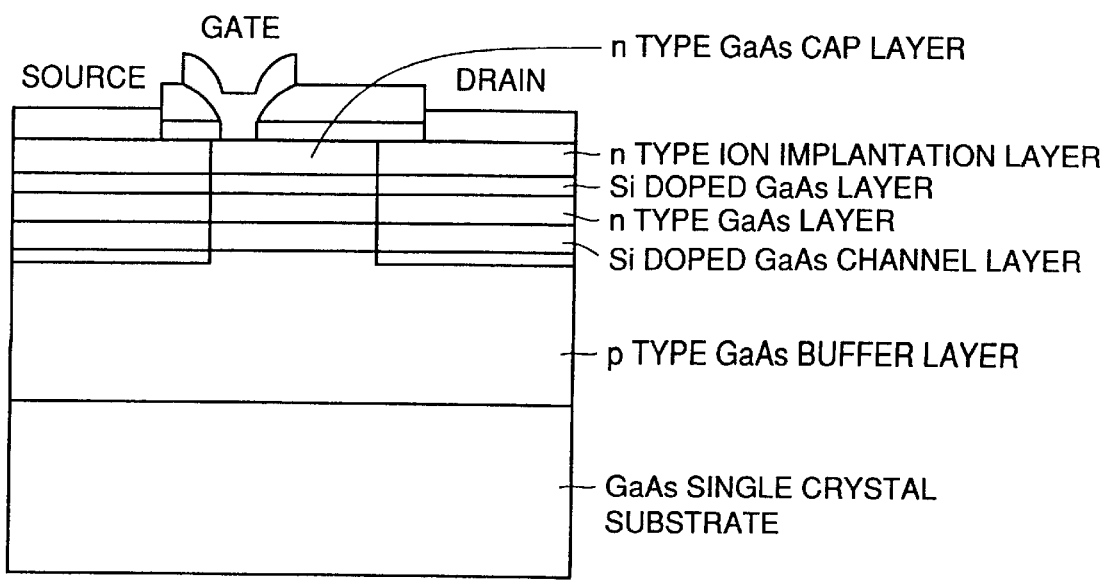
FIG. 2 is a cross sectional view showing a structure of a FET fabricated as an example of the present invention.

As to the breakdown voltage (Vbd), FETs each having the structure shown in FIG. 2 were fabricated by device processing steps after crystal growth by MBE method, and the voltage at which current started to flow in the reverse bias state between the gate and the drain was measured.

Referring more specifically to FIG. 2, a field effect transistor (FET) device is fabricated on a wafer based on a GaAs single crystal substrate 1 according to the invention. The FET includes a p-type GaAs buffer layer 2, an Si-doped GaAs channel layer 3, an n-type GaAs layer 4, an Si-doped GaAs layer 5, and an n-type ion implantation layer 6, as well as an n-type GaAs cap layer 7, successively stacked or formed on the GaAs substrate 1. Moreover, appropriate structuring is carried out to form a gate region 8 between a source region 9 and a drain region 10, as the operative structure of the FET.

TABLE 1

| Samples | 1 | 2 | 3 | 4 | 5 | 6 | 7 |
|---|---|---|---|---|---|---|---|
| Dislocation Density [cm$^{-2}$] | 4050 | 3500 | 5100 | 2500 | 3300 | 5500 | 1200 |
| Carbon Concentration [cm$^{-3}$] | $4.5 × 10^{15}$ | $5.6 × 10^{15}$ | $4.8 × 10^{15}$ | $6.5 × 10^{15}$ | $7.3 × 10^{15}$ | $4.7 × 10^{15}$ | $2.8 × 10^{15}$ |
| Boron Concentration [cm$^{-3}$] | $5.8 × 10^{16}$ | $7.5 × 10^{16}$ | $4.9 × 10^{16}$ | $1.4 × 10^{17}$ | $6.2 × 10^{16}$ | $4.0 × 10^{16}$ | $5.3 × 10^{16}$ |
| Other Impurity Concentration [cm$^{-3}$] | $<1.0 × 10^{16}$ | $<1.0 × 10^{16}$ | $<1.0 × 10^{16}$ | $<1.0 × 10^{16}$ | $<1.0 × 10^{16}$ | $<1.0 × 10^{16}$ | $<1.0 × 10^{16}$ |
| EL2 Concentration [cm$^{-3}$] | $8.1 × 10^{15}$ | $8.1 × 10^{15}$ | $8.3 × 10^{15}$ | $6.8 × 10^{15}$ | $5.9 × 10^{15}$ | $7.2 × 10^{15}$ | $9.2 × 10^{15}$ |
| Resistivity [Ω · cm] | $3.1 × 10^{8}$ | $2.6 × 10^{8}$ | $1.9 × 10^{8}$ | $3.7 × 10^{8}$ | $4.1 × 10^{8}$ | $3.3 × 10^{8}$ | $1.5 × 10^{8}$ |
| Mean Residual Strain | $3.0 × 10^{-6}$ | $2.8 × 10^{-6}$ | $2.5 × 10^{-6}$ | $3.0 × 10^{-6}$ | $3.8 × 10^{-6}$ | $3.0 × 10^{-6}$ | $3.5 × 10^{-6}$ |
| 0.31 eV Level | $2.0 × 10^{15}$ | $1.0 × 10^{15}$ | $3.3 × 10^{15}$ | $7.0 × 10^{15}$ | $1.2 × 10^{15}$ | $1.8 × 10^{15}$ | $2.0 × 10^{15}$ |

TABLE 1-continued

| Samples | 1 | 2 | 3 | 4 | 5 | 6 | 7 |
|---|---|---|---|---|---|---|---|
| Concentration [cm$^{-3}$] | | | | | | | |
| Number of Slips (per wafer) | 0 | 1 | 0 | 0 | 2 | 1 | 1 |
| Vbd [V] | 23.8 | 23 | 22.8 | 24 | 23.8 | 23.5 | 22.5 |

TABLE 2

| Samples | 8 | 9 | 10 | 11 | 12 | 13 | 14 |
|---|---|---|---|---|---|---|---|
| Dislocation Density [cm$^{-2}$] | 5800 | 4600 | 1800 | 4900 | 7000 | 5100 | 3600 |
| Carbon Concentration [cm$^{-3}$] | $4.0 \times 10^{15}$ | $1.5 \times 10^{16}$ | $6.5 \times 10^{15}$ | $1.0 \times 10^{16}$ | $9.0 \times 10^{15}$ | $1.5 \times 10^{15}$ | $3.0 \times 10^{15}$ |
| Boron Concentration [cm$^{-3}$] | $2.5 \times 10^{16}$ | $4.0 \times 10^{16}$ | $3.8 \times 10^{16}$ | $2.0 \times 10^{17}$ | $1.0 \times 10^{17}$ | $1.2 \times 10^{16}$ | $5.5 \times 10^{16}$ |
| Other Impurity Concentration [cm$^{-3}$] | $<1.0 \times 10^{16}$ | $<1.0 \times 10^{16}$ | $<1.0 \times 10^{16}$ | $<1.0 \times 10^{16}$ | $<1.0 \times 10^{16}$ | $<1.0 \times 10^{16}$ | $<1.0 \times 10^{16}$ |
| EL2 Concentration [cm$^{-3}$] | $8.5 \times 10^{15}$ | $9.5 \times 10^{15}$ | $7.7 \times 10^{15}$ | $7.0 \times 10^{15}$ | $8.5 \times 10^{15}$ | $9.5 \times 10^{15}$ | $1.4 \times 10^{16}$ |
| Resistivity [Ω · cm] | $2.0 \times 10^{8}$ | $4.5 \times 10^{8}$ | $4.0 \times 10^{8}$ | $5.0 \times 10^{8}$ | $4.7 \times 10^{8}$ | $1.2 \times 10^{7}$ | $1.5 \times 10^{8}$ |
| Mean Residual Strain | $3.5 \times 10^{-6}$ | $2.4 \times 10^{-6}$ | $3.7 \times 10^{-6}$ | $2.5 \times 10^{-6}$ | $2.9 \times 10^{-6}$ | $4.5 \times 10^{-6}$ | $5.5 \times 10^{-6}$ |
| 0.31 eV Level Concentration [cm$^{-3}$] | $2.5 \times 10^{15}$ | $4.0 \times 10^{15}$ | $3.0 \times 10^{14}$ | $5.0 \times 10^{14}$ | $3.0 \times 10^{14}$ | $2.0 \times 10^{15}$ | $3.4 \times 10^{14}$ |
| Number of Slips [per wafer] | 3 | 4 | 0 | 3 | 0 | 4 | 6 |
| Vbd [V] | 20.8 | 21.0 | 22 | 22.5 | 22.8 | 15 | 19 |

TABLE 3

| Samples | 15 | 16 | 17 | 18 | 19 | 20 | 21 |
|---|---|---|---|---|---|---|---|
| Dislocation Density [cm$^{-2}$] | 3800 | 80000 | 7200 | 2500 | 5010 | 3700 | 8200 |
| Carbon Concentration [cm$^{-3}$] | $4.0 \times 10^{15}$ | $1.1 \times 10^{15}$ | $5.0 \times 10^{15}$ | $1.0 \times 10^{16}$ | $8.5 \times 10^{15}$ | $3.5 \times 10^{15}$ | $3.0 \times 10^{15}$ |
| Boron Concentration [cm$^{-3}$] | $1.0 \times 10^{16}$ | $1.0 \times 10^{15}$ | $7.0 \times 10^{15}$ | $9.0 \times 10^{15}$ | $9.5 \times 10^{17}$ | $8.7 \times 10^{15}$ | $3.5 \times 10^{17}$ |
| Other Impurity Concentration [cm$^{-3}$) | $<1.0 \times 10^{16}$ | $<1.0 \times 10^{16}$ | $<1.0 \times 10^{16}$ | $<1.0 \times 10^{16}$ | $<1.0 \times 10^{16}$ | $<1.0 \times 10^{16}$ | $<1.0 \times 10^{16}$ |
| EL2 Concentration [cm$^{-3}$] | $8.5 \times 10^{15}$ | $1.4 \times 10^{16}$ | $8.0 \times 10^{15}$ | $9.8 \times 10^{15}$ | $9.5 \times 10^{15}$ | $9.5 \times 10^{15}$ | $9.5 \times 10^{15}$ |
| Resistivity [Ω · cm] | $2.0 \times 10^{8}$ | $1.4 \times 10^{7}$ | $2.0 \times 10^{18}$ | $4.2 \times 10^{8}$ | $4.3 \times 10^{8}$ | $2.0 \times 10^{8}$ | $1.5 \times 10^{8}$ |
| Mean Residual Strain | $3.5 \times 10^{-6}$ | $1.4 \times 10^{-5}$ | $5.0 \times 10^{-6}$ | $3.5 \times 10^{-6}$ | $2.9 \times 10^{-6}$ | $4.4 \times 10^{-6}$ | $5.6 \times 10^{-6}$ |
| 0.31 eV Level Concentration [cm$^{-3}$] | $2.5 \times 10^{15}$ | $4.0 \times 10^{14}$ | $1.5 \times 10^{15}$ | $1.8 \times 10^{15}$ | $3.0 \times 10^{15}$ | $2.1 \times 10^{15}$ | $3.4 \times 10^{15}$ |
| Number of Slips [per wafer] | 6 | 22 | 5 | 4 | 4 | 4 | 3 |
| Vbd [V] | 20 | 14 | 22.0 | 22.6 | 22.1 | 21.8 | 20.5 |

Referring to Tables 1 to 3, samples 1 to 12 are GaAs single crystal substrates satisfying the characteristics of a broad aspect of the present invention, and particularly, samples 1 to 9 are GaAs single crystal substrates which also satisfy the requirements of a preferred aspect of the present invention. As compared with samples 10 to 12, these samples have higher value of Vbd in general, and it can be seen that the breakdown withstanding characteristic at the time of fabricating devices is further improved.

Samples 13 to 21 are GaAs single crystal substrates of comparative examples. More specifically, sample 13 has carbon concentration, boron concentration and resistivity value out of the ranges defined by the present invention. Sample 14 has EL2 concentration and the 0.31 eV level concentration out of the ranges defined by the present invention. Sample 15 has boron concentration out of the range defined by the present invention. Sample 16 has dislocation density, carbon concentration, boron concentration, EL2 concentration, resistivity, mean residual strain and 0.31 eV level concentration out of the ranges defined by the present invention. Sample 17 has boron concentration and resistivity out of the ranges defined by the present invention. Samples 18 to 21 have the boron concentration out of the range defined by the present invention.

It can be seen that the GaAs single crystal substrates of the comparative examples generally have larger number of slips and smaller Vbd values.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A GaAs single crystal substrate, having
   a mean dislocation density in plane of at most $2 \times 10^{4}$ cm$^{-2}$,
   a carbon concentration of 2.5 to $20.0 \times 10^{15}$ cm$^{-3}$,
   a boron concentration of 2.0 to $20.0 \times 10^{16}$ cm$^{-3}$,
   a total concentration of all impurities other than carbon and boron of at most $1 \times 10^{17}$ cm$^{-3}$, an EL2 concentration of 5.0 to $10.0 \times 10^{15}$ cm$^{-3}$, a resistivity of 1.0 to $5.0 \times 10^8$ Ω·cm, and a mean residual strain measured by photoelastic analysis of at most $1.0 \times 10^{15}$.

2. The GaAs single crystal substrate according to claim 1, further having a deep level concentration of a deep level with an activation energy of 0.31±0.05 eV, said deep level concentration as detected by a thermally stimulated current method being at least $1 \times 10^{15}$ cm$^{-3}$.

3. An epitaxial wafer comprising the GaAs single crystal substrate according to claim 1, and a thin film having a thickness of at least 0.1 μm epitaxially grown on said GaAs single crystal substrate.

4. An epitaxial wafer comprising the GaAs single crystal substrate according to claim 2, and a thin film having a thickness of at least 0.1 μm epitaxially grown on said GaAs single crystal substrate.

5. The epitaxial wafer according to claim 3, having a breakdown voltage of at least 22.8 volts, and having at most 3 slips in a wafer area of 100 mm diameter.

6. The epitaxial wafer according to claim 4, having a breakdown voltage of at least 23 volts, and having at most 2 slips in a wafer area of 100 mm diameter.

7. The GaAs single crystal substrate according to claim 1, wherein said carbon concentration is at least $1.5 \times 10^{16}$ cm$^{-3}$.

8. The GaAs single crystal substrate according to claim 1, wherein said boron concentration is at least $1.4 \times 10^{17}$ cm$^{-3}$.

9. The GaAs single crystal substrate according to claim 1, wherein said total concentration of all impurities other than carbon and boron is less than $1 \times 10^{16}$ cm$^{-3}$.

10. The GaAs single crystal substrate according to claim 1, wherein said mean dislocation density is at most $7 \times 10^3$ cm$^{-2}$, said carbon concentration is in a range from 2.8 to $15 \times 10^{15}$ cm$^{-3}$, said boron concentration is in a range from 2.5 to $20 \times 10^{16}$ cm$^{-3}$, said total concentration of all impurities other than carbon and boron is less than $1 \times 10^{16}$ cm$^{-3}$, said EL2 concentration is in a range from 5.9 to $9.5 \times 10^{15}$ cm$^{-3}$, said resistivity is in a range from 1.5 to $4.5 \times 10^8$ Ω·cm, and said mean residual strain is at most $3.8 \times 10^{-6}$.

* * * * *

UNITED STATES PATENT AND TRADEMARK OFFICE
CERTIFICATE OF CORRECTION

PATENT NO.    : 6,180,269 B1
DATED         : January 30, 2001
INVENTOR(S)   : Yoshiaki Hagi et al.

It is certified that error appears in the above-identified patent and that said Letters Patent is hereby corrected as shown below:

Title page,
Title page should be deleted, to be replaced with the attached title page.

Drawings,
Drawing sheets, consisting of Figs. 1 and 2, should be deleted to be replaced with the drawing sheets, consisting of Figs. 1 and 2, as shown on the attached pages.

United States Patent
Hagi et al.

(10) Patent No.: US 6,180,269 B1
(45) Date of Patent: Jan. 30, 2001

(54) GAAS SINGLE CRYSTAL SUBSTRATE AND EPITAXIAL WAFER USING THE SAME

(75) Inventors: Yoshiaki Hagi; Ryusuke Nakai, both of Itami (JP)

(73) Assignee: Sumitomo Electric Industries, Ltd., Osaka (JP)

(*) Notice: Under 35 U.S.C. 154(b), the term of this patent shall be extended for 0 days.

(21) Appl. No.: 09/334,215

(22) Filed: Jun. 16, 1999

(30) Foreign Application Priority Data

Sep. 28, 1998 (JP) .............................. 10-273097

(51) Int. Cl.$^7$ ........................................... B32B 9/00
(52) U.S. Cl. .................... 428/697; 428/689; 428/704; 428/336; 257/607; 257/609; 257/610; 117/954; 420/555; 420/579
(58) Field of Search .......................... 257/607, 609, 257/610; 428/689, 704, 336; 117/954; 420/555, 579

(56) References Cited

U.S. PATENT DOCUMENTS

| | | | |
|---|---|---|---|
| 4,609,530 | * 9/1986 | Morioka et al. | 420/555 |
| 5,229,637 | 7/1993 | Suga et al. | |
| 5,498,595 | * 3/1996 | Eccleston | 505/235 |
| 5,614,754 | * 3/1997 | Inoue | 257/421 |

FOREIGN PATENT DOCUMENTS

| | | |
|---|---|---|
| 0803593 | 10/1997 | (EP) . |
| 0927777 | 7/1999 | (EP) . |
| 01054724 | 3/1989 | (JP) . |
| 02038400 | 2/1990 | (JP) . |

OTHER PUBLICATIONS

"Studies on correlation between the quality of GaAs LEC crystals and the inert gas pressure" by M. Seifert et al.; Journal of Crystal Growth 158 (1996), pp. 409–417, Federal Republic of Germany.

"Low dislocation density 6–inch diameter GaAs single crystals grown by the VCZ method" by T. Kawase et al., Inst. Phys. Conf. Ser. No. 129, Chapter 2, Int. Symp. GaAs and Related Compounds, Karuizawa, Japan 1992.

"Low–dislocation–density and Low–residual–strain Semi––insulating GaAs Grown by Vertical Boat Method" by T. Kawase et al.; Proc. Of the 9th Conf. on Semiconducting and Insulating Materials, Toulouse, France (1996) pp. 275–278.

* cited by examiner

Primary Examiner—Deborah Jones
Assistant Examiner—Jason D Resnick
(74) Attorney, Agent, or Firm—W. F. Fasse; W. G. Fasse

(57) ABSTRACT

A GaAs single crystal substrate and an epitaxial wafer using the same suppress the generation of slips during growth of the epitaxial layer, and improve the breakdown withstanding characteristic of devices fabricated on such substrates. The GaAs single crystal substrate has a mean dislocation density in plane of at most $2 \times 10^4$ cm$^{-2}$, a carbon concentration of 2.5 to $20.0 \times 10^{15}$ cm$^{-3}$, a boron concentration of 2.0 to $20.0 \times 10^{16}$ cm$^{-3}$, an impurity concentration other than carbon and boron of at most $1 \times 10^{17}$ cm$^{-3}$, an EL2 concentration of 5.0 to $10.0 \times 10^{15}$ cm$^{-3}$, resistivity of 1.0 to $5.0 \times 10^8$ Ω·cm and a mean residual strain measured by photoelastic analysis of at most $1.0 \times 10^{-5}$.

10 Claims, 1 Drawing Sheet

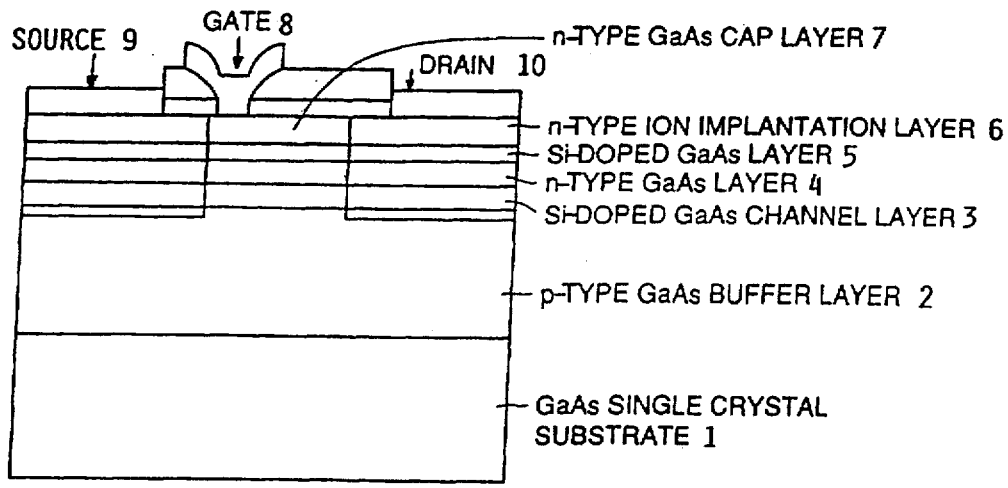

UNITED STATES PATENT AND TRADEMARK OFFICE
CERTIFICATE OF CORRECTION

PATENT NO. : 6,180,269 B1
DATED : January 30, 2001
INVENTOR(S) : Yoshiaki Hagi et al.

It is certified that error appears in the above-identified patent and that said Letters Patent is hereby corrected as shown below:

Fig. 1 should be:

FIG. 1

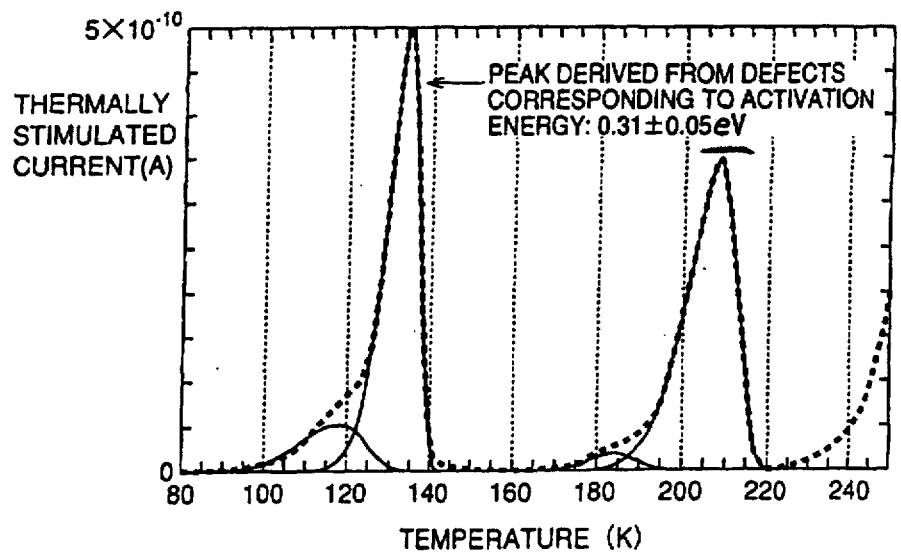

UNITED STATES PATENT AND TRADEMARK OFFICE
CERTIFICATE OF CORRECTION

PATENT NO. : 6,180,269 B1
DATED : January 30, 2001
INVENTOR(S) : Yoshiaki Hagi et al.

It is certified that error appears in the above-identified patent and that said Letters Patent is hereby corrected as shown below:

Fig. 2 should be:

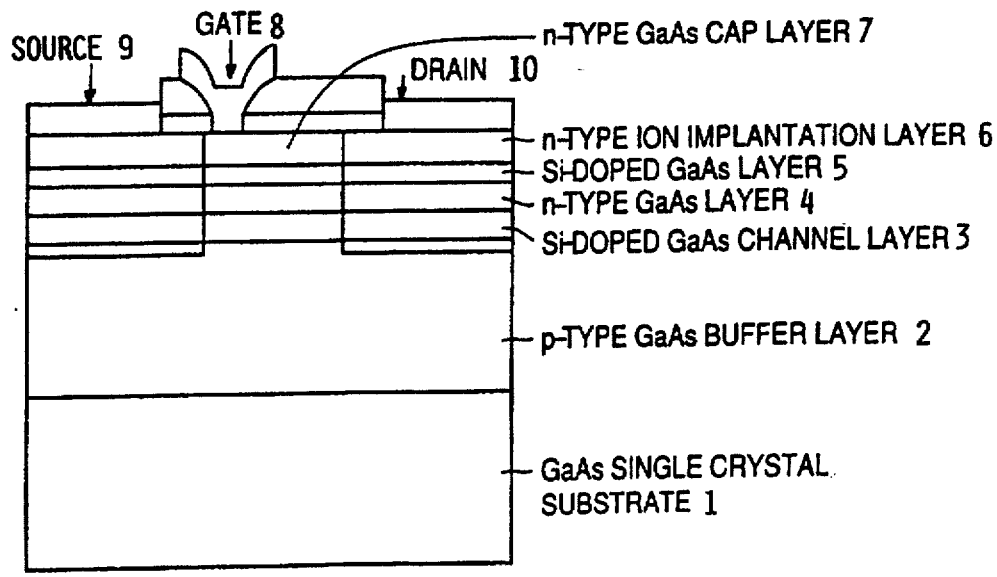

UNITED STATES PATENT AND TRADEMARK OFFICE
CERTIFICATE OF CORRECTION

PATENT NO.    : 6,180,269 B1
DATED         : January 30, 2001
INVENTOR(S)   : Yoshiaki Hagi et al.

It is certified that error appears in the above-identified patent and that said Letters Patent is hereby corrected as shown below:

Column 3,
Line 35, before "single", "GaSa" should read -- GaAs --;

Column 4,
Line 21, after "of", insert -- carrier --;
Line 29, after "of", replace "0.31±0,05" by -- 0.31±0.05 --;

Column 8,
Line 18, before "said", replace "$cm^{31\ 3}$" by -- $cm^{-3}$ --.

Signed and Sealed this

Fifth Day of February, 2002

Attest:

JAMES E. ROGAN
*Attesting Officer*   *Director of the United States Patent and Trademark Office*